United States Patent [19]

Hatta

[11] Patent Number: 5,508,948
[45] Date of Patent: Apr. 16, 1996

[54] NUMERIC REPRESENTATION CONVERTING APPARATUS AND VECTOR PROCESSOR UNIT SUCH APPARATUS

[75] Inventor: Koichi Hatta, Kawasaki, Japan

[73] Assignee: Fujitsu Limited, Kawasaki, Japan

[21] Appl. No.: 353,374

[22] Filed: Dec. 2, 1994

Related U.S. Application Data

[63] Continuation of Ser. No. 949,550, Nov. 19, 1992, abandoned.

[30] Foreign Application Priority Data

Mar. 19, 1991 [JP] Japan ..................................... 3-55183

[51] Int. Cl.$^6$ ................................ G06F 7/00; G06F 7/38
[52] U.S. Cl. ..................................... 364/715.03; 364/745
[58] Field of Search ......................... 364/715.01, 715.03, 364/715.04, 715.08, 736, 748, 745

[56] References Cited

U.S. PATENT DOCUMENTS

| | | | |
|---|---|---|---|
| 4,511,990 | 4/1985 | Hagiwara et al. | 364/715.03 X |
| 4,700,319 | 10/1987 | Steiner | 364/518 |
| 5,161,117 | 11/1992 | Waggener, Jr. | 364/715.03 |

FOREIGN PATENT DOCUMENTS

| | | |
|---|---|---|
| 63-70333 | 3/1988 | Japan. |
| 1-207823 | 8/1989 | Japan. |
| 3-40129 | 2/1991 | Japan. |
| 2186105 | 8/1987 | United Kingdom. |

*Primary Examiner*—Roy N. Envall, Jr.
*Assistant Examiner*—Chuong D. Ngo
*Attorney, Agent, or Firm*—Staas & Halsey

[57] ABSTRACT

A numeric representation converting apparatus comprises a weight determining circuit, a decimal alignment circuit, a converting circuit, and a selecting circuit. The weight determining circuit determines the weight of a mantissa part of an input floating-point number, based on the value of an exponent part of that number. The decimal alignment circuit shifts digits of the value of the mantissa based on the determined weight of the mantissa. The converting circuit converts the value of the integer part of the value obtained by the decimal alignment circuit to a representation of a negative number, and truncates the value of the negative number either in the direction of the more negative number or the less negative number. Finally, the selecting circuit outputs either the integer part of the value obtained by the decimal alignment circuit or the value obtained by the converting circuit.

6 Claims, 10 Drawing Sheets

FIG.8

|  | S | E | M |
|---|---|---|---|
| +2.0 | 0 | 001 | 1000 |
| -2.0 | 1 | 001 | 1000 |
| +2.5 | 0 | 001 | 1010 |
| -2.5 | 1 | 001 | 1010 |

FIG.9

| EXPONENT PART | AMOUNT OF SHIFT |
|---|---|
| -4 | 7 |
| -3 | 6 |
| -2 | 5 |
| -1 | 4 |
| 0 | 3 |
| 1 | 2 |
| 2 | 1 |
| 3 | 0 |

FIG.10

| SHIFTER | | BIT INVERTING CIRCUIT | | | NAND | ADDER CIRCUIT | SELECTOR | CONVERSION RESULT |
|---|---|---|---|---|---|---|---|---|
| | | | B | C | | | | |
| +2.0 | 0010 | 1101 | 0 | 0 | 1 | 1110 | 0010 | 00010 (2) |
| -2.0 | 0010 | 1101 | 0 | 1 | 1 | 1110 | 0010 | 00010 (2) |
| +2.5 | 0010 | 1101 | 1 | 0 | 1 | 1110 | 1110 | 11110 (-2) |
| -2.5 | 0010 | 1101 | 1 | 1 | 1 | 1110 | 1110 | 11110 (-2) |
| | | | | 0 | 0 | 1110 | 0010 | 00010 (2) |
| | | | | 1 | 1 | 1101 | 1110 | 00010 (2) |
| | | | | 0 | 1 | 1101 | 1110 | 11110 (-2) |
| | | | | 1 | 0 | 1101 | 1101 | 11101 (-3) |

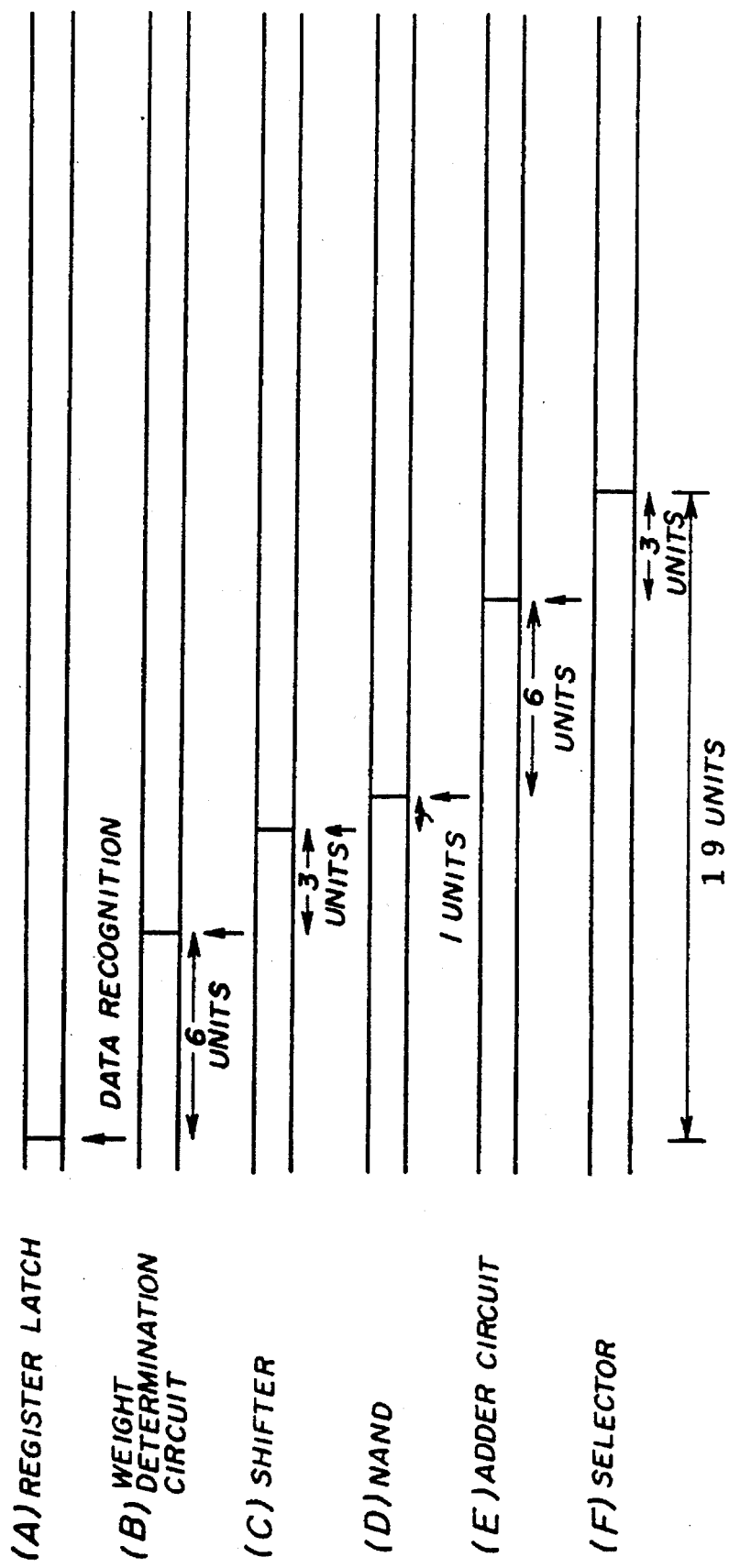

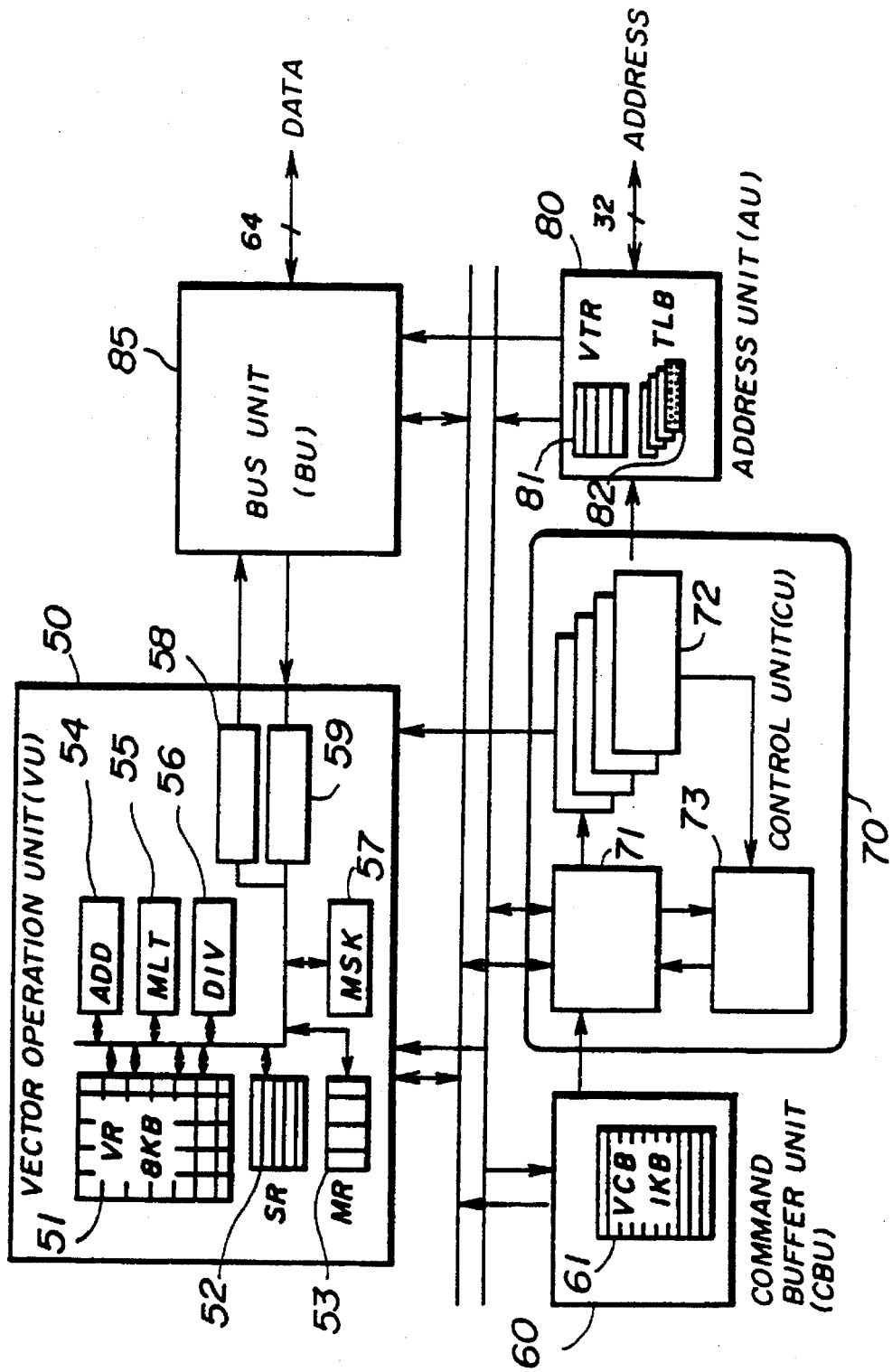

NUMERIC REPRESENTATION CONVERTING APPARATUS AND VECTOR PROCESSOR UNIT SUCH APPARATUS

This application is a continuation of application Ser. No. 07/949,550, filed Nov. 19, 1992, now abandoned.

FIELD OF THE INVENTION

The present invention pertains to a numeric representation converting apparatus having a function for converting, to a fixed-point number, a floating-point number consisting of a sign part, an exponent part, and a mantissa part and for outputting the result of conversion. It pertains more specifically to a numeric representation converting apparatus in which a reduction of a number of circuits needed for the conversion to a negative fixed-point number and a speed-up of operation are accomplished, and to a vector processor unit employing such an apparatus.

Means normally used to represent data used in a numeric operation include fixed-point representation and floating-point representation. In fixed-point representation, the position of a decimal point is usually set at the right of an LSB, and the LSB is given a weight "1". Also, in this fixed-point representation, a negative value is represented by a complement on 2. On the other hand, floating-point representation represents a number by dividing it into a sign part, an exponent part, and a mantissa part.

Most numeric operation apparatuses have a function of switching from fixed-point representation to floating-point representation and vice versa. When converting a floating-point number to a fixed-point number, the value to the right of the decimal point is either carried or truncated, since a fixed-point number is normally an integer.

How a floating-point number is converted to a fixed-point number, wherein the value to the right of a decimal point is truncated, will now be discussed. For example, when converting a floating-point number "2.5" to a fixed-point number, "0.5", which is to the right of the decimal point, is truncated, thus giving a converted result of "2". When "–2.5" is to be converted, the converted result can either be "–2" or "–3". The former is obtained when, for example, the sign represents only a direction, wherein it is desired that the truncated result be close to zero. The latter is obtained when, for example, a negative bias is applied to what is originally a positive number due to a computational reason (a problem of dynamic range, etc.), wherein it is desired that the truncated value be a large negative number in view of the fact that the negative bias is to be removed later to restore the positive number.

DESCRIPTION OF THE RELATED ART

An example of a conventional numeric representation converting apparatus is shown in FIG. 1. As shown in FIG. 1, a sign part (S), an exponent part (E), and a mantissa part (M) of a number represented by a floating-point representation are stored in registers 10a, 10b, and 10c respectively.

A weight determining circuit 11 determines a weight of the mantissa part (M) on the basis of the exponent part (E) of the input floating-point number.

A shifter 12 functions as a decimal alignment means for performing decimal alignment by shifting the digits of the mantissa part of the input floating-point number on the basis of the weight determined above. This shifter 12 is equipped with a detecting portion 12a for detecting any numbers to the right of the decimal point.

A two's complement generating circuit 13, a decrementer 14, and a first selector 15 convert an integer part of the number obtained by the above-mentioned decimal alignment to a twos complement, and also function as a converting means 20 having a rounding operation function, which converting means truncates the value to the right of the decimal point in either of two truncating directions, on the basis of an externally provided truncation direction instruction (C).

As shown in FIG. 2, the two's complement generating circuit 13 is comprised of a bit inverting circuit 13a for bit-inverting an integer part of the output from the shifter 2, and an adder circuit 13b for adding 1 to the output from this bit inverting circuit. Thus, the two's complement generating circuit 13 outputs the integer part of the output from the shifter 12, which integer part is represented in a two's complement form. This output from the two's complement generating circuit 13 corresponds to the value of the integer part obtained when the value to the right of the decimal point, which value is shifted in the shifter 12, is truncated in the direction approaching zero.

The decrementer 14 is a circuit for subtracting 1 from the number output from the twos complement generating circuit 13. Thus the decrementer 14 outputs the value of the integer part obtained when the value to the right of the decimal point, which value is shifted in the shifter 12, is truncated in the large negative direction.

As shown in FIG. 3, the first selector 15 is comprised of an AND circuit 15a supplied with a detection signal B and an instruction signal C, an inverter 15b for inverting the output from the AND circuit 15a, an AND circuit 15c supplied with the output from the decrementer, an AND circuit 15d supplied with the output from the twos complement generating circuit 13, and an OR circuit 15e supplied with the outputs from both of the AND circuits 15c and 15d. The selection is based on the detection signal B submitted from the detecting portion 12a which belongs to the shifter 12 and on the truncation direction instruction signal C. The first selector 15 selects and outputs, when the detection signal B is 0, that is, when there is no value to the right of the decimal point, or when the instruction signal C is 0, the output from the two's complement generating circuit 13, which is namely the value of the integer part obtained when the value to the right of the decimal point is truncated in the direction approaching zero. The first selector 15 selects and outputs, when the detection signal B is 1, which means that there is a value to the right of the decimal point, and the instruction signal is 1, the output from the decrementer 14, which is namely the value of the integer part obtained when the value to the right of the decimal point is truncated in the negatively increasing direction.

As shown in FIG. 4, the second selector 16 is comprised of an inverter 16a for inverting the sign part (S), an AND circuit 16b supplied with the output from the selector 15, an AND circuit 16c supplied with the output from the shifter 12, and an OR circuit 16d supplied with the outputs from the AND circuits 16b and 16c. The second selector 16 selects, when the sign part (S) of the register 10a is 0, which indicates a positive number, the integer part of the value obtained by the shifter 12, which functions as the decimal alignment means. The second selector 16 selects and outputs, when the sign part (S) is 1, which indicates a negative number, the value obtained by the converting means 20 which has a rounding operation function.

A conversion result register 17 temporarily stores the sign part (S) of the input floating-point number and the output from the selector 16, and then finally outputs them as fixed-point numbers.

A description will be given below of an operation of the numeric representation converting apparatus of the above configuration in accordance with FIG. 5. The description below assumes not only that the input floating-point number is negative but also that there is a value to the right of the decimal point ("–2.5" is taken as an example). Any person skilled in the art will easily recognize that a simple truncation will be performed if the number is positive (in the case of "+2.0" or "+2.5"), or if the number is negative but there is no value to the right of the decimal point (in the case of "–2.0").

Assuming that the floating-point number "–2.5" is input into the registers 10a–10c, it is evident that S=1, E=001, and M=1010.

The weight determining circuit 11 outputs "2" as an amount of shift (weight), on the basis of E=1. This prompts the content of the shifter 12 (M=1010) to be shifted two bits to the right, resulting in the content of the integer part of the shifter 12 becoming (0010), and the value of the detection signal B becoming "1".

Subsequently, the two's complement generating circuit 13 carries out an operation (1101)+(0001)=(1110) so as to obtain a complement (1110) on the number (0010), which complement (1110) is fed, as described above, to one of the inputs of the selector 15 as an output subject to a truncation in the direction approaching zero. On the other hand, the decrementer 14 carries out an operation (1110)–(0001)= (1101), the result of this operation being fed to the other input of the selector 15 as an output subject to a truncation in the negatively increasing direction, as mentioned above.

The first selector 15 performs a selective control by truncating in the direction approaching zero when the truncation direction instruction signal C is "0" and by truncating in the negatively increasing direction when the signal C is "1" with the result that the first selector 15 outputs (1110) when the truncation direction instruction signal C is "0", and outputs (1101) when the truncation direction instruction signal C is "1".

The second selector 16 performs a selective control by selecting the output from the shifter 12 when the sign part S is "0", and by selecting the output from the first selector 15 when the sign part S is "1", with the result that the second selector 16 outputs either (1110) or (1101) in correspondence with the sign part S value of "1".

And finally, the conversion result register 17 outputs either (11110) or (11101), the signed fixed-point numbers desired.

The delay time for one gate is designateed as being one unit. After a floating-point number is stored in each of the registers 10a–10c, which storage is represented in FIG. 6(A), a delay of six units is incurred, as shown in FIG. 6(B), in the weight determining circuit 11, which is a type of adder circuit. A delay of three units is incurred, as shown in FIG. 6(C), in the shifter 12. A delay of six units is incurred, as shown in FIG. 6(D), in the two's complement generating circuit 13 having the adder circuit 13b. A delay of six units is incurred, as shown in FIG. 6(E), in the decrementer 14. Finally and a delay of three units each is incurred, as shown in FIG. 6(F) and (G), in each of the selectors 15 and 16. That is, a delay of a total of twenty seven units is incurred.

Thus the presence of two adder circuits in a conventional numeric representation converting apparatus, namely, the decrementer (a type of adder circuit) 14 and the adder circuit 13b belonging to the two's complement generating circuit 13, causes an operation time to become relatively long and makes a circuit configuration relatively complex.

Accordingly, an object of the present invention is to provide a novel and useful numeric representation converting apparatus capable of eliminating the above disadvantages, and a vector processor unit employing such an apparatus.

Other objects of the present invention are to speed up operations of the apparatus where a floating-point number is subject to two kinds of truncation and converted to a fixed-point number, and to simplify the circuit configuration.

SUMMARY OF THE INVENTION

The above objects of the present invention are achieved by a numeric representation converting apparatus having a function for converting a floating-point number consisting of a sign part (S), an exponent part (E), and a mantissa part (M) to a fixed-point number and outputting the converted result. That apparatus comprises a:

weight determining circuit (11) for determining a weight of a mantissa part (M) on the basis of a value of an exponent part (E) of an input floating-point number;

decimal alignment circuit (12) for performing decimal alignment by shifting digits of a value of the mantissa part (M) of the input floating-point number on the basis of said determined weight;

converting circuit (30) having a rounding operation function for converting a value of an integer part of a value obtained by said decimal alignment so as to represent the value in a negative representation and for truncating the value to the right of a decimal point in either of two truncating directions on the basis of an externally provided truncation direction instruction; and selecting circuit (16) for selecting and outputting either an integer part of a value obtained by said decimal alignment circuit or a value obtained by the converting circuit having a rounding operation function, on the basis of a sign part of the input floating-point number. The apparatus is further characterized in that the converting circuit (30) comprises a bit inverting circuit (31) for bit-inverting an integer part of a value obtained by said decimal alignment circuit (12), a carry digit determining circuit (32) for determining the value of a carry digit on the basis of information indicating the presence or absence of a value shifted to the right of a decimal point due to the digit shifting in said decimal alignment circuit (12), and on the basis of an externally provided truncation direction instruction, and adding circuit (33) for adding a value output from said bit inverting circuit (31) to a carry digit determined by said carry digit determining circuit (32).

BRIEF DESCRIPTION OF THE DRAWINGS

FIG. 8 describes a floating-point representation;

FIG. 9 describes a relationship between an exponent part and an amount of shift;

FIG. 10 describes an operation of the configuration of the present invention shown in FIG. 7;

FIG. 11 is an operational timing chart of FIG. 7; and

FIG. 12 shows a configuration of a vector processor unit.

DESCRIPTION OF THE PREFERRED EMBODIMENTS

Figure 1:
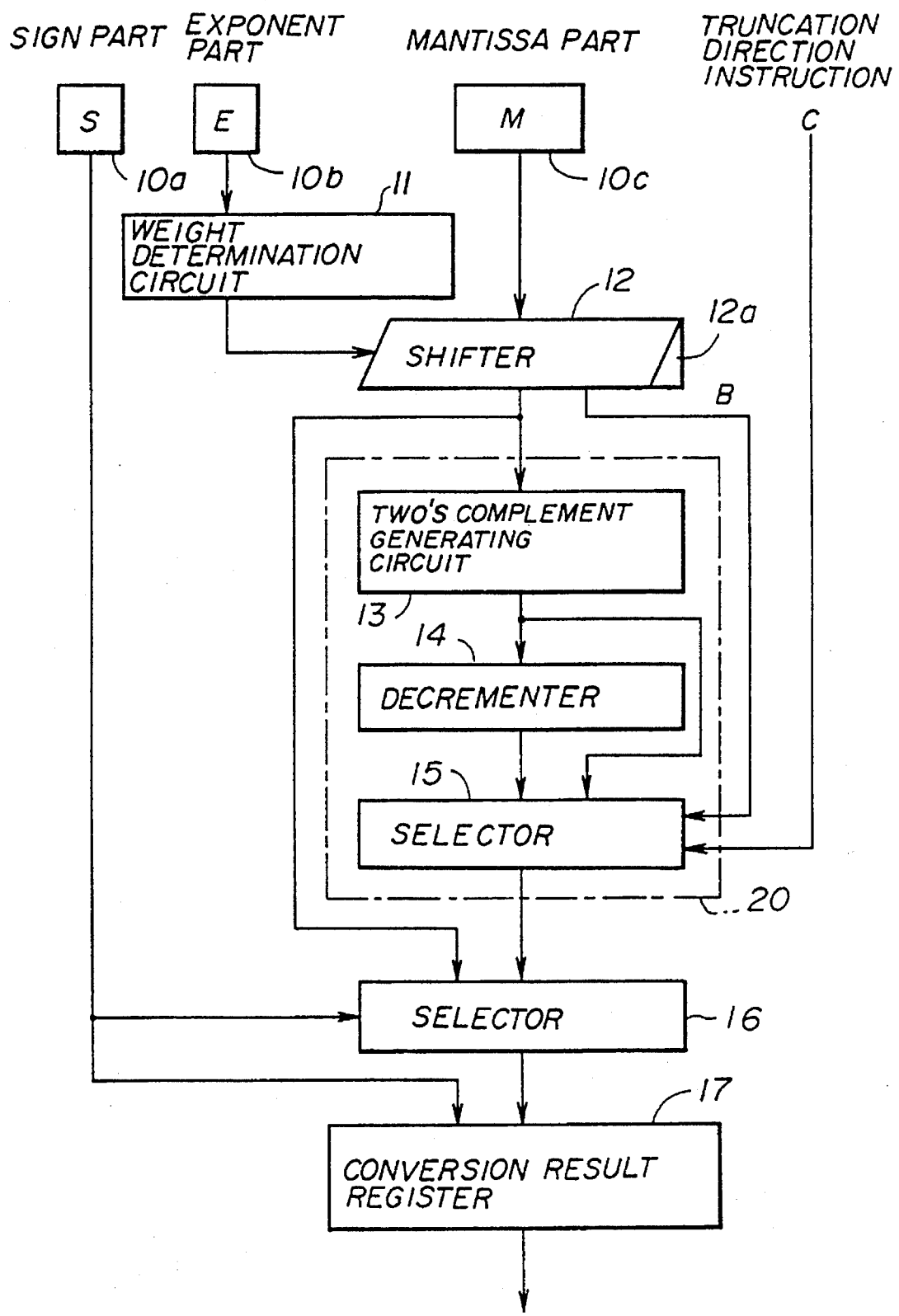
FIG. 1 shows a configuration of a conventional apparatus.
Figure 2:
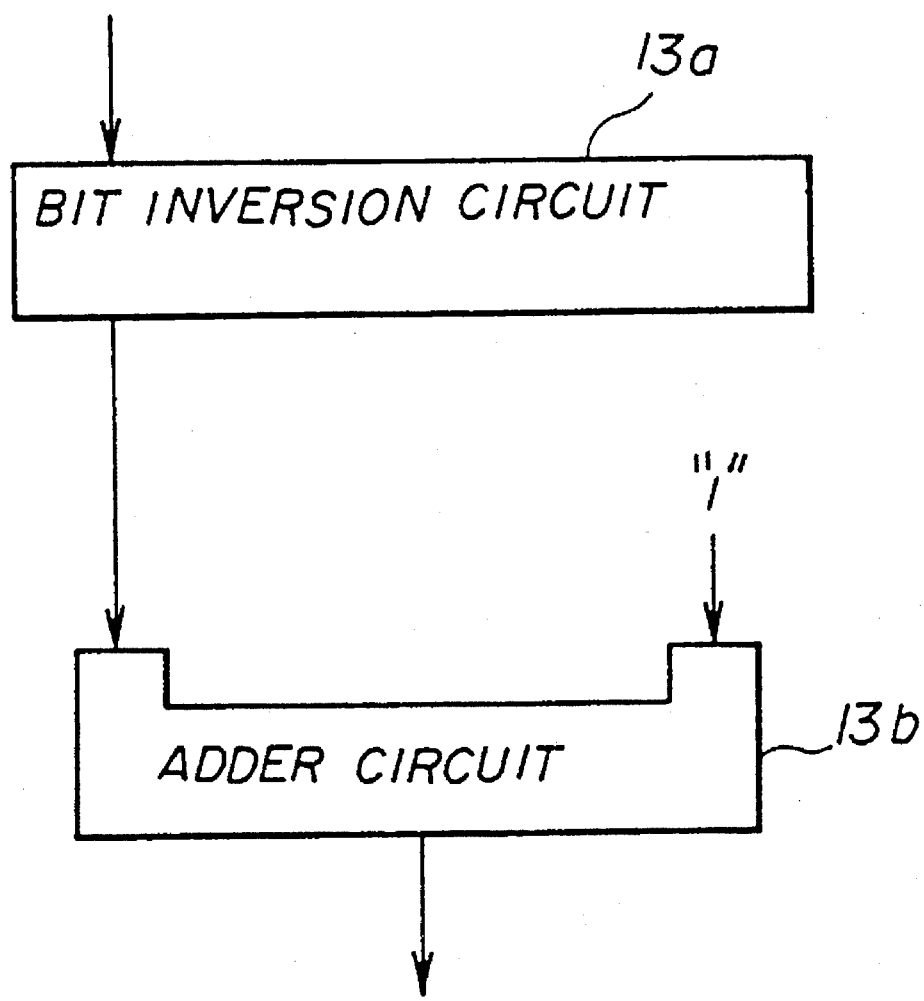
FIG. 2 is a block diagram of a two's complement generating circuit.
Figure 3:
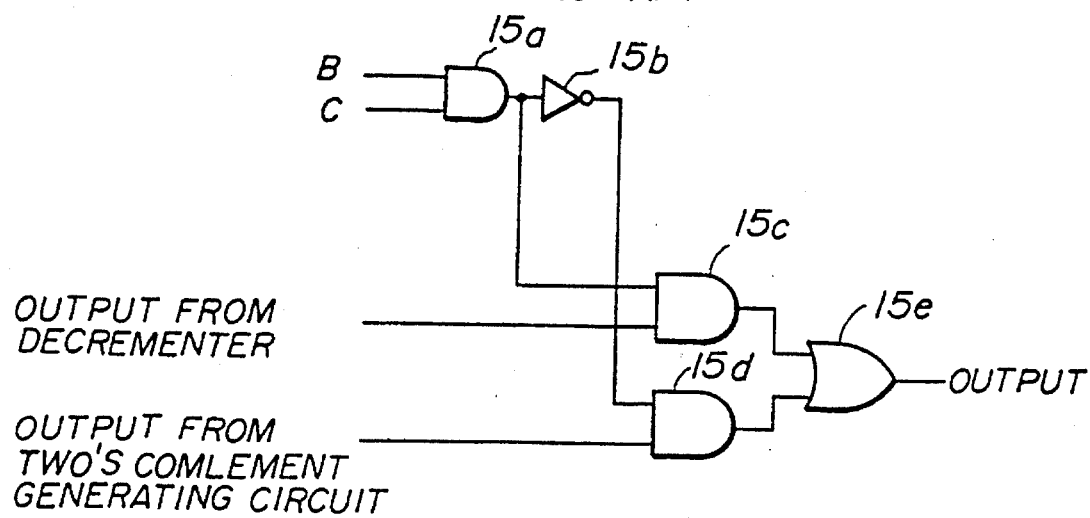
FIG. 3 is a circuit diagram of a first selector.
Figure 4:
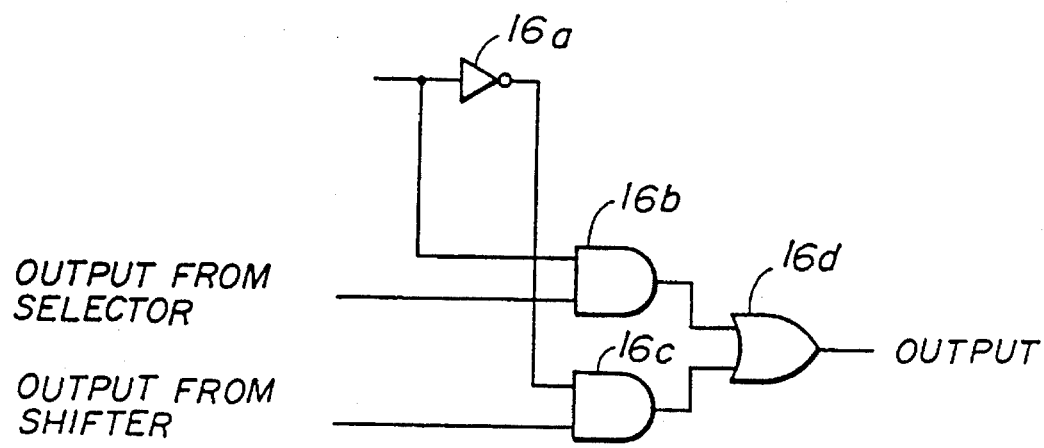
FIG. 4 is a circuit diagram of a second selector.
Figure 5:
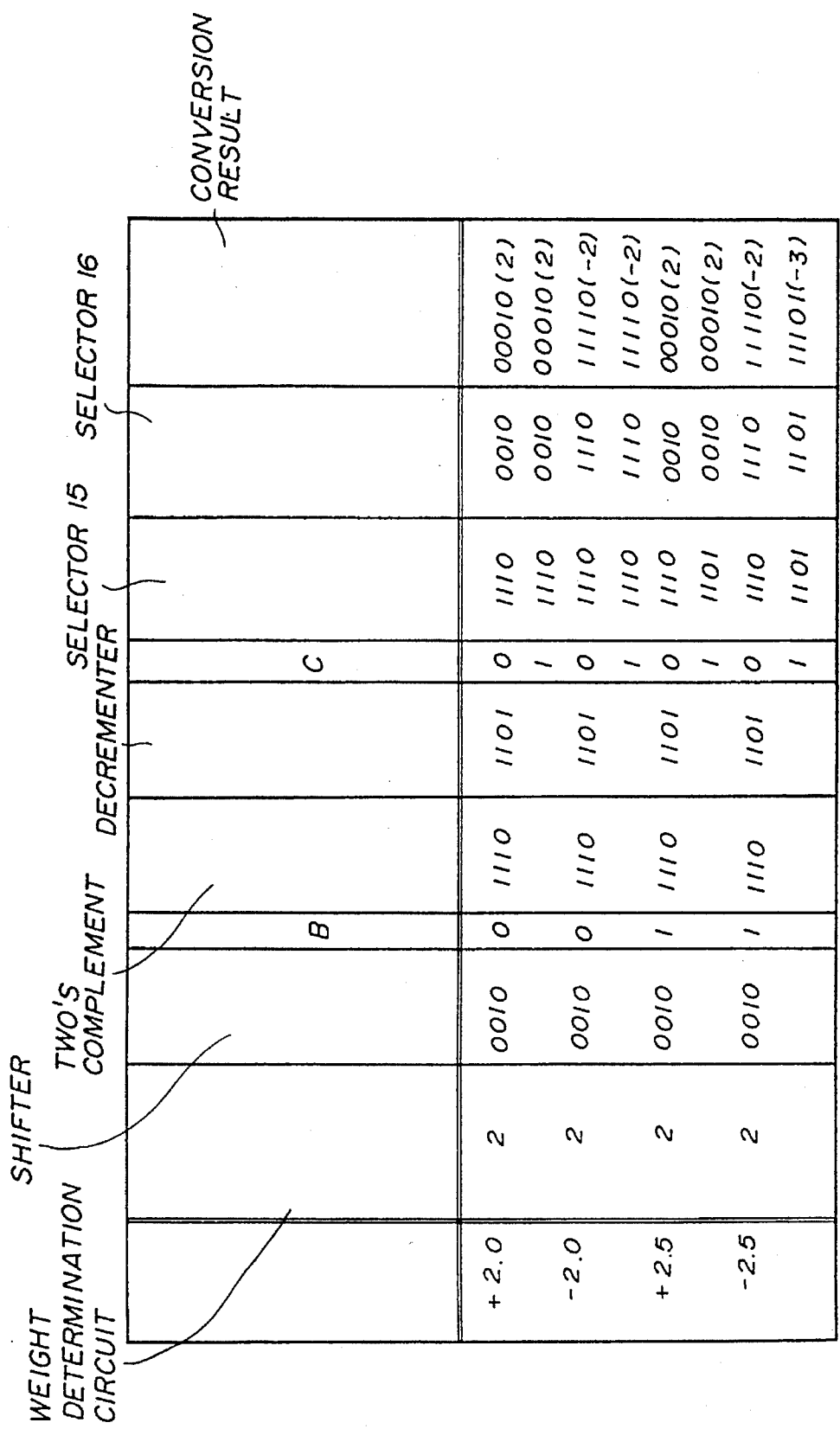
FIG. 5 is a diagram describing an operation of the conventional apparatus shown in FIG. 1.
Figure 6:
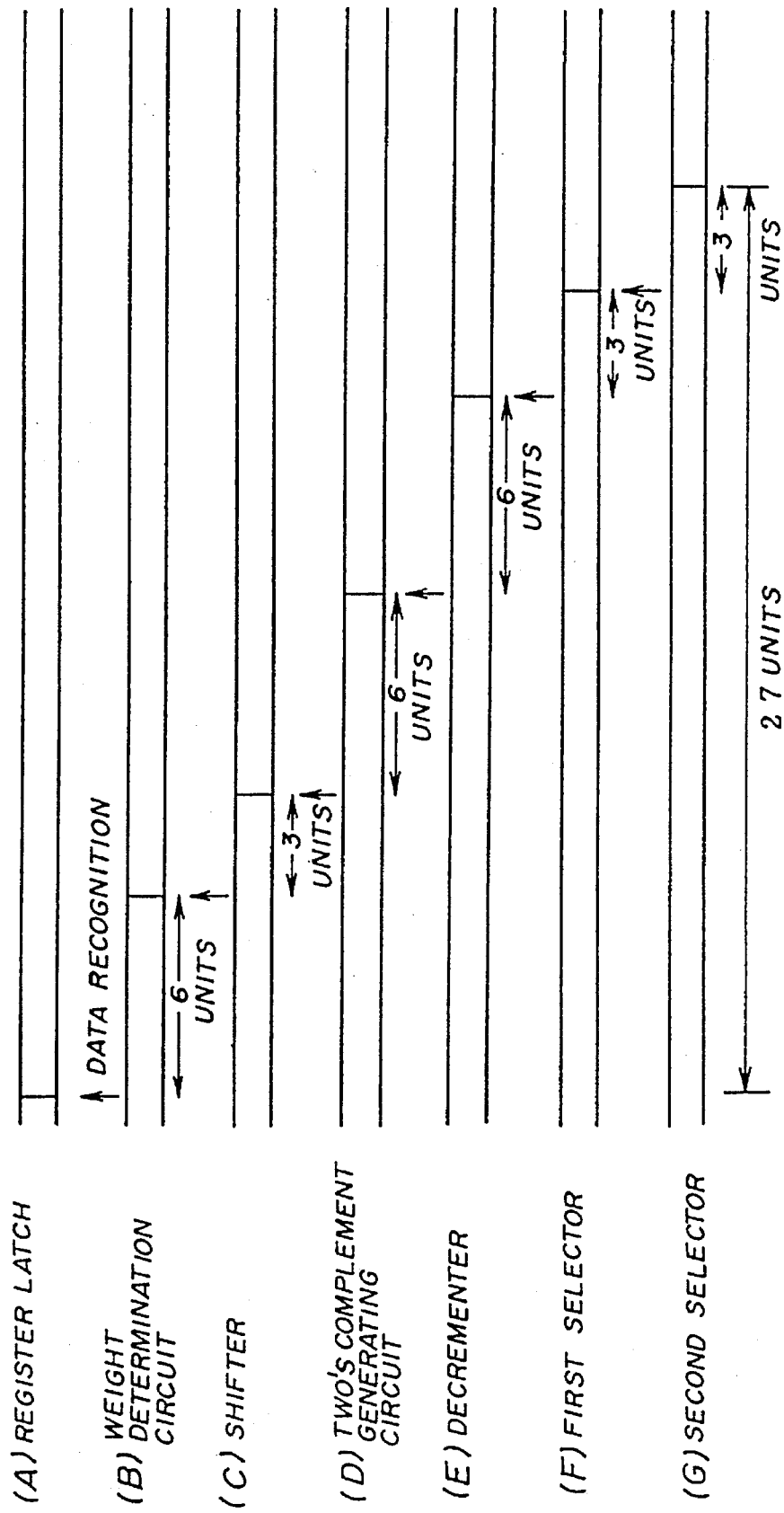
FIG. 6 is an operational timing chart of FIG. 1.
Figure 7:
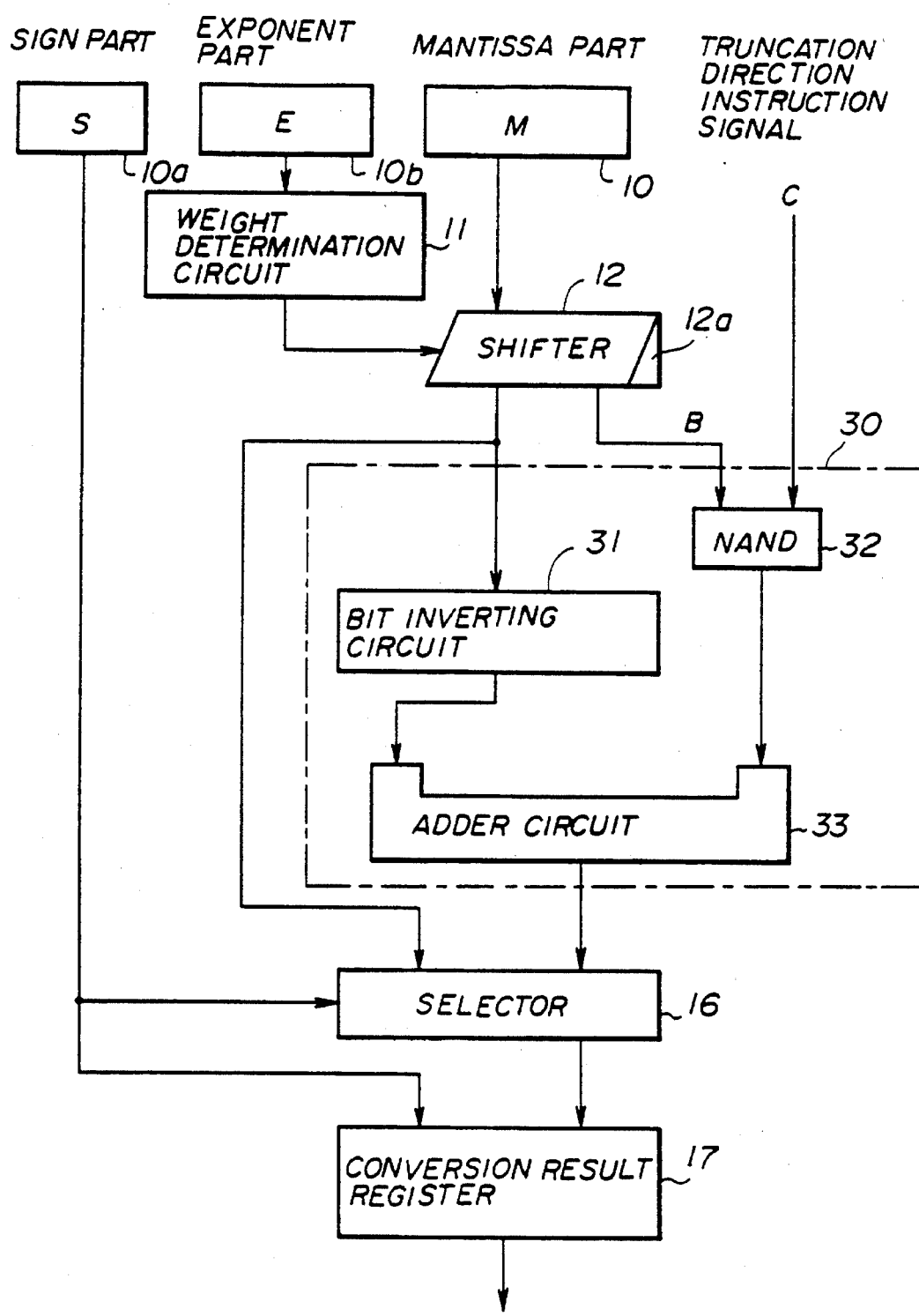
FIG. 7 shows a configuration of the present invention.

FIG. 7 shows a configuration of an embodiment of the present invention. Referring to FIG. 7, parts that are the same as those in FIG. 1 are given the same reference numerals and the descriptions thereof are omitted.

In FIG.7, it is assumed that the sign part (S), the exponent part (E), and the mantissa part (M) stored in the registers 10a–10c respectively contain 1 bit, 3 bits, and 4 bits, respectively, as shown in FIG. 8.

The weight determining circuit 11 is a subtracter circuit designed to subtract the value of the exponent part in the register 10b from a predetermined value (3 in this case) and to output an amount of shift shown in FIG. 9 which corresponds with the value of the exponent part.

This embodiment differs from the conventional technology in that there is provided a converting circuit 30 having a rounding operation function comprised of a bit inverting circuit 31, a NAND circuit 32, and an adder circuit 33.

Specifically, the bit inverting circuit 31 bit-inverts the integer part of the value obtained from the shifter 12, which functions as a decimal alignment circuit, and outputs the inverted result. The output from this bit inverting circuit 31 is fed to one of the inputs of the adder circuit 33. The output value from this bit inverting circuit 31 corresponds to the output value obtained when a truncation is carried out in the negatively increasing direction.

The NAND circuit 32 is a circuit which NANDs the detection signal B from the detecting portion 12a belonging to the shifter 12, and the truncation direction instruction signal C, the output therefrom being fed to the other input of the adder circuit 33 as a carry digit ("1" when a truncation is performed in the direction approaching zero, and "0" when a truncation is performed in the negatively increasing direction).

The adder circuit 33 adds the output from the bit inverting circuit 31 to the output from the NAND circuit 32, the sum thereof being fed to the selector 16 as a negative fixed-point number to be finally output.

An operation of the embodiment of the above configuration will be described below with reference to FIG. 10. The description below assumes not only that the input floating-point number is negative but also that there is a value to the right of the decimal point ("−2.5" is taken as an example). Any person skilled in the art will easily recognize that a simple truncation will be performed if the number is positive (in the case of "+2.0" or "+2.5"), or if the number is negative but there is no value to the right of the decimal point (in the case of "−2.0").

Assuming that the floating-point number "−2.5" is input, it is evident that S=1, E=001, and M=1010.

The weight determining circuit 11 outputs "2" as an amount of shift (weight), on the basis of E=1. This prompts the content of the shifter 12 (M=1010) to be shifted two bits to the right, resulting in the content of the integer part of the shifter 12 becoming (0010), and the value of the detection signal B becoming "1."

The bit inverting circuit 31 outputs the value (1101) obtained by bit-inverting the content (0010) of the integer part of the shifter 12. This value (1101) is fed to one of the inputs of the adder circuit 11 as a value to be output when a truncation is performed in the negatively increasing direction.

The detection signal B from the detecting portion 12a of the shifter 12 is "1", while the truncation direction instruction signal C is "0" when a truncation is performed in the direction approaching zero and "1" when a truncation is performed in the negatively increasing direction. Therefore, the output from the NAND circuit 32 is "1" when a truncation is performed in the direction approaching zero and "0" when a truncation is performed in the negatively increasing direction. The output from this NAND circuit 32 is fed to the other input of the adder circuit 33 as a carry digit.

Consequently, the adder circuit 33 outputs the value (1110="−2") in accordance with an operation (1101)+(0001)=(1110) when a truncation is performed in the direction approaching zero, while the adder circuit 33 outputs the value (1101="−3") in accordance with an operation (1101)+(0000)=(1101) when a truncation is performed in the negatively increasing direction.

Subsequently, the output from this adder circuit 33 is forwarded to the conversion result register 17 via the selector 16, from which register the signed fixed-point number (11110) or (11101) is output.

A delay time for one gate is designated as being one unit. After a floating-point number is stored in each of the registers 10a–10c, which storage is represented in FIG. 11(A), a delay of six units is incurred, as shown in FIG. 11(B), in the weight determining circuit 11, which is a kind of adder circuit. A delay of three units is incurred, as shown in FIG. 11(C), in the shifter 12. A delay of one unit is incurred, as shown in FIG. 11(D), in the NAND circuit 32. A delay of six units is incurred, as shown in FIG. 11(E), in the adder circuit 33. Finally a delay of three units is incurred, as shown in FIG. 11(F), in the selector 16. That is, a delay totaling nineteen units is incurred.

Because, in the above conventional converting apparatus, the converting circuit 30 having a rounding operation function includes two adder circuits 33, a relatively large delay is caused. A speed-up of the operation is achieved by reducing an operation time by about 30% as compared with that of the conventional apparatus. Also, the circuit configuration is simpler than that of the conventional apparatus.

FIG. 12 shows a configuration of a vector processor unit (VPU) in which the present invention is applied. This vector processor unit is a one-chip semiconductor integrated circuit. Referring to FIG. 12, a vector unit (VU) 50 is provided with a vector register 51 for storing vector data, a scalar register 52 for storing scalar data, and a mask register 53 for storing mask data. An adder portion 54, a multiplier portion execute respective pipeline processes, namely addition, multiplication, and division of numeric data. A mask portion 57 executes a mask process at the time of a vector operation. A data output latch 58 and a data input latch 59 respectively output data to the outside and input data from the outside.

A command buffer unit (CBU) 60 is provided with a command buffer (VCB) 61 for storing a command. The command read out from this command buffer 61 is fed to a decoding portion 71 within a control unit (CU) 70, where the command is decoded. On the basis of the result of this decoding, a pipeline control portion 72 performs pipeline control on the adder portion 54, the multiplier portion 55, and the divider portion 56 in the vector unit 50. A scoreboard portion 73 manages the usage of each of the registers in the vector unit 50, which registers are used in the above-mentioned pipeline control.

An address unit (80) converts virtual addresses to physical addresses by using a VTR (vector translation register) 81 and a TLB (translation lookaside buffer) 82 and handles the exchange of addresses between the inside and outside of the chip. A bus control unit 85 handles exchange of data between the inside and outside of the chip.

The numeric representation converting apparatus of the present invention shown in FIG. 7 is provided in the adder portion 54 of the vector unit 50, and is used for converting floating-point vector data to a fixed-point number before vector data is added. In a large-scale integrated circuit capable of performing a high-speed operation like that performed by the vector processor unit, it is important that a chip area be made smaller and an operation be made faster by a simpler circuit. The above are realized by the simple circuit configuration of the present invention.

POSSIBLE APPLICATION IN INDUSTRY

As described above, in accordance with the numeric representation converting apparatus of the present invention, a speed-up of an operation and a simplified circuit configuration can be attained. Further, in the vector processor unit employing the present invention a chip area can be reduced and a speed-up of an operation can be achieved.

I claim:

1. A numeric representation converting apparatus having a function of converting an input floating-point number, having a sign part, an exponent part having a first value, and a mantissa part having a second value, to a fixed-point number and outputting the converted result, said apparatus comprising:

weight determining means for determining a weight of said mantissa part based on said first value;

decimal alignment means, coupled to said weight determining means, for performing decimal alignment by shifting digits of said second value based on said determined weight and for producing a third value having an integer part;

converting means having a rounding operation function for converting said integer part to a fourth value which is a negative representation of the integer part, and for truncating the fourth value in one of a first truncating direction and a second truncating direction based on an externally provided truncation direction instruction;

selecting means, coupled to said converting means and to said decimal alignment means, for selecting and outputting either one of the integer part of the third value and the fifth value, based on said sign part; and said converting means comprising:

bit inverting means for bit-inverting said third value and for producing a sixth value, carry digit determining means for determining a carry digit value based on information indicating a presence of a value shifted right of a decimal point due to digit shifting in said decimal alignment means, and based on said externally provided truncation direction instruction, and adding means, coupled to said bit inverting means and to said carry digit determining means, for adding the sixth value to the carry digit value, wherein conversion of the floating-point number to the fixed-point number is based on the sign part, the exponent part, the mantissa part, and the truncation direction instruction without requiring further inputs to the numeric representation converting apparatus.

2. A numeric representation converging apparatus as claimed in claim 1, wherein said carry digit determining means comprises a NAND circuit.

3. A vector processor unit converting input floating-point vector data, having a sign part, an exponent part having a first value, and a mantissa part having a second value, to a fixed-point representation, said vector processor unit comprising:

a vector unit including an adder comprising:

a numeric representation converting apparatus outputting the fixed-point representation, said numeric representation converting apparatus comprising:

weight determining means for determining a weight of said mantissa part based on said first value;

decimal alignment means, coupled to said weight determining means, for performing decimal alignment by shifting digits of said second value based on said determined weight and for producing a third value having an integer part;

converting means, coupled to said decimal alignment means, for receiving an externally provided truncation direction instruction, for having a rounding operation function for converting said integer part to a fourth value, which is a negative representation of the integer part, and for truncating the fourth value in one of a first truncating direction and a second truncating direction based on the externally provided truncation direction instruction, for producing a fifth value, said converting means further comprising:

bit inverting means for bit-inverting said third value and for producing a sixth value, carry digit determining means for determining a carry digit value based on information indicating a presence of a value shifted right of a decimal point due to digit shifting in said decimal alignment means, and based on said externally provided truncation direction instruction, and adding means, coupled to said bit inverting means and to said carry digit determining means, for adding the sixth value to the carry digit value; and selecting means, coupled to said converting means and to said decimal alignment means, for selecting and outputting either one of the integer part of the third value and the fifth value, based on said sign part, thereby converting the input floating-point vector data to the fixed-point representation, wherein conversion of the floating-point vector data to the fixed-point representation is based on the sign part, the exponent part, the mantissa part, and the truncation direction instruction without requiring further inputs to the vector processor unit.

4. A vector processor unit as claimed in claim 3, wherein said vector processor unit resides on a single semiconductor chip.

5. A numeric representation converting apparatus converting floating-point data, having a sign, an exponent, and a mantissa, into a fixed-point representation, said numeric representation converting apparatus comprising:

a weight alignment circuit, determining a weight of the mantissa based on the exponent;

a decimal alignment circuit, coupled to said weight determining circuit, shifting digits of the mantissa based on the weight of the mantissa and producing a first output value having an integer part, and a second output value; and a converting circuit, coupled to the decimal alignment circuit, receiving an externally provided truncation direction instruction, converting the integer part into negative number representation, and truncating the negative number representation in one of a more negative direction and a less negative direction responsive to the externally provided truncation direction instruction, said converting circuit having a rounding operation unit comprising:

a bit inverting circuit bit-inverting the integer part and outputting an inverted result;

a NAND circuit NANDing the second output value and the externally provided truncation direction instruction, and outputting a carry digit; and an adder circuit, coupled to the bit inverting circuit and to the NAND circuit, receiving the carry digit and adding the inverted result to the carry digit, and outputting a negative fixed-point number, wherein conversion of the floating-point data to the fixed-point number is based on the sign, the exponent, the mantissa, and the truncation direction instruction without requiring further inputs to the numeric representation converting apparatus.

6. A numeric representation converting apparatus converting an input floating-point number, having a decimal point, a sign part, an exponent part having a first value, and a mantissa part, having a second value, to a fixed-point number and outputting the fixed-point number, said apparatus comprising:

weight determining means for determining a weight of said mantissa part based on said first value;

decimal alignment means, coupled to said weight determining means, for performing decimal alignment by shifting digits of said second value based on said weight of said mantissa part and for producing a third value, having an integer part, and a fourth value indicating a presence of a value shifted right of the decimal point due to shifting of the digits of said second value;

converting means coupled to said decimal alignment means and having a rounding operation function for receiving an externally provided truncation direction instruction signal and said integer part of said third value, and for converting said integer part of said third value to a sixth value, said converting means comprising:

bit inverting means for bit-inverting said third value and for producing a fifth value, which is a negative representation of the integer part of said third value, carry digit determining means for determining a carry digit value based on said fourth value and on said externally provided truncation direction instruction, and adding means, coupled to said bit inverting means and to said carry digit determining means, for truncating the fifth value in one of a first truncating direction and a second truncating direction based on the carry digit and for producing the sixth value; and selecting means, coupled to said converting means, to said sign part, and to said decimal alignment means, for selecting and outputting one of the integer part of the third value and the sixth value based on said sign part, wherein conversion of the floating-point number to the fixed-point number is based on the sign part, the exponent part, the mantissa part, and the truncation direction instruction without requiring further inputs to the numeric representation converting apparatus.

\* \* \* \* \*

UNITED STATES PATENT AND TRADEMARK OFFICE
CERTIFICATE OF CORRECTION

PATENT NO. : 5,508,948
DATED : April 16, 1996
INVENTOR(S) : Hatta

Page 1 of 2

It is certified that error appears in the above-indentified patent and that said Letters Patent is hereby corrected as shown below:

```
Title Page, Item [54], line 3, after "Unit"
     insert --Using--.
Title Page, Item [30], insert the following line
     --March 18, 1992   PCT....PCT/JP92/00324--.
Column 1, line 3, after "Unit" insert --Using--.
  Column 2, line 6, "twos" should be --two's--.
Column 3, line 37, after "0" insert --,--.
Column 3, line 63, after "Finally" insert --,--.
Column 4, line 23, delete ":".
Column 4, line 55, after "and" insert --an--.
```

UNITED STATES PATENT AND TRADEMARK OFFICE
CERTIFICATE OF CORRECTION

PATENT NO. : 5,508,948
DATED : April 16, 1996
INVENTOR(S) : Hatta

It is certified that error appears in the above-indentified patent and that said Letters Patent is hereby corrected as shown below:

Column 6, line 43, after "Finally" delete "and", insert
--,--.
Column 6, line 60, before "execute" insert
--55, and divider portion 56 in the vector unit 50--.
Column 7, line 28, delete entire line.
* Column 8, line 11, "converging" should be
--converting--.

Signed and Sealed this

Fifth Day of November, 1996

Attest:

BRUCE LEHMAN

Attesting Officer                Commissioner of Patents and Trademarks